(12) United States Patent
Lan

(10) Patent No.: US 11,558,055 B2
(45) Date of Patent: Jan. 17, 2023

(54) CLOCK-GATING SYNCHRONIZATION CIRCUIT AND METHOD OF CLOCK-GATING SYNCHRONIZATION

(71) Applicant: Nuvoton Technology Corporation, Hsinchu (TW)

(72) Inventor: Yung-Chi Lan, Taichung (TW)

(73) Assignee: NUVOTON TECHNOLOGY CORPORATION, Hsinchu Science Park (TW)

(*) Notice: Subject to any disclaimer, the term of this patent is extended or adjusted under 35 U.S.C. 154(b) by 0 days.

(21) Appl. No.: 17/582,735

(22) Filed: Jan. 24, 2022

(65) Prior Publication Data
US 2022/0247411 A1 Aug. 4, 2022

(30) Foreign Application Priority Data
Feb. 4, 2021 (TW) .................... 110104308

(51) Int. Cl.
H03K 19/096 (2006.01)
H03L 7/00 (2006.01)
G06F 1/08 (2006.01)
G06F 1/12 (2006.01)
H03K 19/21 (2006.01)

(52) U.S. Cl.
CPC ............ *H03K 19/096* (2013.01); *G06F 1/08* (2013.01); *G06F 1/12* (2013.01); *H03L 7/00* (2013.01); *H03K 19/21* (2013.01)

(58) Field of Classification Search
None
See application file for complete search history.

(56) References Cited

U.S. PATENT DOCUMENTS

| 7,007,186 | B1 | 2/2006 | Li et al. |
| 7,944,241 | B1 | 5/2011 | Sharma et al. |
| 10,840,917 | B1* | 11/2020 | Cali ............... H03L 7/093 |
| 2020/0202062 | A1 | 6/2020 | Louvat et al. |

FOREIGN PATENT DOCUMENTS

| CN | 106802709 A | 6/2017 |
| CN | 110770832 A | 2/2020 |
| CN | 111831053 A | 10/2020 |

\* cited by examiner

*Primary Examiner* — Cassandra F Cox
(74) *Attorney, Agent, or Firm* — Muncy, Geissler, Olds & Lowe, P.C.

(57) ABSTRACT

A clock-gating synchronization circuit is provided. The clock-gating synchronization circuit includes a synchronization circuit and clock-gating circuit. The synchronization circuit is configured to perform a synchronization operation to convert a first control signal in a first clock domain into a second control signal in a second clock domain, transmit the second control signal to an electronic circuit, and determine whether the first control signal and the second control signal are the same to generate a first signal. The clock-gating circuit is configured to perform clock gating on the clock signal from a clock generator in the second clock domain according to the first signal to generate a gated clock signal, and transmit the gated clock signal to the electronic circuit and the synchronization circuit, wherein the synchronization operation performed by the synchronization circuit is controlled by the gated clock signal.

10 Claims, 5 Drawing Sheets

CLOCK-GATING SYNCHRONIZATION CIRCUIT AND METHOD OF CLOCK-GATING SYNCHRONIZATION

CROSS REFERENCE TO RELATED APPLICATIONS

This application claims the benefit of Taiwan Patent Application No. 110104308, filed on Feb. 4, 2021, in the Taiwan intellectual Property Office, the disclosure of which is incorporated by reference herein in its entirety.

BACKGROUND OF THE INVENTION

Field of the Invention

The present invention relates to synchronization circuits, and, in particular, to a clock-gating synchronization circuit and a method for clock-gating synchronization.

Description of the Related Art

In integrated circuits designed to have low power consumption, it is common to use clock-gating technology to stop the clock signal provided to the D trip-flop for lower-power design in situations where the integrated circuit needs to save power. However, if a clock-gating design is added to a conventional cross-clock domain synchronization circuit, the isolated clock-gating (ICG) cell will also face the problem of cross-clock domain. To deal with cross-clock domain, the design of the synchronization circuit will be quite complicated, and the gate count of the synchronization circuit will increase, resulting in a higher cost to manufacture the integrated circuit.

BRIEF SUMMARY OF THE INVENTION

Therefore, a clock-gating synchronization circuit and a method of clock-gating synchronization are provided to solve the aforementioned problem.

In an exemplary embodiment, a clock-gating synchronization circuit is provided. The clock-gating synchronization circuit includes a synchronization circuit and clock-gating circuit. The synchronization circuit is configured to perform a synchronization operation to convert a first control signal in a first clock domain into a second control signal in a second clock domain, transmit the second control signal to an electronic circuit, and determine whether the first control signal and the second control signal are the same to generate a first signal. The clock-gating circuit is configured to perform clock gating on the clock signal from a clock generator in the second clock domain according to the first signal to generate a gated clock signal, and transmit the gated clock signal to the electronic circuit and the synchronization circuit, wherein the synchronization operation performed by the synchronization circuit is controlled by the gated clock signal.

In some embodiments, tfre synchronization circuit comprises a first D flip-flop, a second D flip flop, and an XOR gate, wherein the first control signal passes through the first D flip-flop and the second D flip-flop to generate the second control signal, and the first control signal and the second control signal are input to the XOR gate to generate the first signal.

In some embodiments, the clock-gating circuit comprises a third D flip-flop, a fourth D flip-flop, a multiplexer, a first OR gate, an isolated clock-gating (ICG) cell, a fifth D flip-flop, and a second OR gate. The first signal passes through the third D flip-flop and the fourth D flip-flop to generate a second signal, and the first signal and the second signal are input to the multiplexer. The multiplexer is controlled by a clock-enable signal to generatea toggle signal. The toggle signal and an operating signal from the electronic circuit are input to the first OR gate to generate a clock-gating enable signal. The ICG cell perform clock gating on the clock signal according to the clock-gating enable signal to generate the gated clock signal_and the clock-gating enable signal is input to the fifth D flip-flop to generate a third signal. The clock-gating enable signal and the third signal are input to the second OR gate to generate the clock-enable signal, which is used to control the clock generator to output the clock signal.

In some embodiments in response to a change of a logic state of the second control signal, the electronic circuit starts to perform tasks. While the electronic circuit is performing the tasks, the operating signal output by the electronic circuit is in a high-logic state. In response to the tasks performed by the electronic circuit being completed, the operating signal output by the electronic circuit is in a low-logic state.

In some embodiments, the clock-gating synchronization circuit further includes: a second synchronization circuit, configured to perform a second synchronization operation to convert a third control signal in the first clock domain to a fourth control signal in the second clock domain, transmit the fourth control signal to the electronic circuit, and perform an XOR operation on the third control signal and the fourth control signal to generate a fourth signal.

In some embodiments, the synchronization circuit and the second synchronization circuit are coupled to the clock-gating circuit through a third OR gate, and the first signal and the forth signal are input to the third OR gate to generate a fifth signal, and the clock-gating circuit performs clock gating on the clock signal according to the fifth signal to generate the gated clock signal.

In some embodiments, in response to the clock generator turning off the clock signal, the clock-gating circuit sets the clock-enable signal to the high-logic state in an asynchronous manner to control the clock generator to turn on the clock signal.

In other exemplary embodiment, a method of clock-gating synchronization for use in a clock-gating synchronization circuit is provided. The synchronization circuit comprises a synchronization circuit and a clock-gating circuit. The method includes the following steps: utilizing the synchronization circuit to perform a synchronization operation to convert a first control signal in a first clock domain into a second control signal in a second clock domain, and transmit the second control signal to an electronic circuit; utilizing the synchronization circuit to determine whether the first control signal and the second control signal are the same to generate a first signal; utilizing the clock-gating circuit to perform clock gating on the clock signal from a clock generator in the second clock domain according to the first signal to generate a gated clock signal; and utilizing the clock-gating circuit to transmit the gated clock signal to the electronic circuit and the synchronization circuit, wherein the synchronization operation performed by the synchronization circuit is controlled by the gated clock signal.

DETAILED DESCRIPTION OF THE INVENTION

The following description is made for the purpose of illustrating the general principles of the disclosure and should not be taken in a limiting sense. The scope of the disclosure is best determined by reference to the appended claims.

It should be understood that the words "comprising", "including" and the like used in this specification are used to indicate the existence of specific technical characteristics, numerical values, method steps, work processes, components and/or components, but not It does not exclude that you can add more technical features, values, method steps, job processing, components, components, or any combination of the above.

Figure 1:
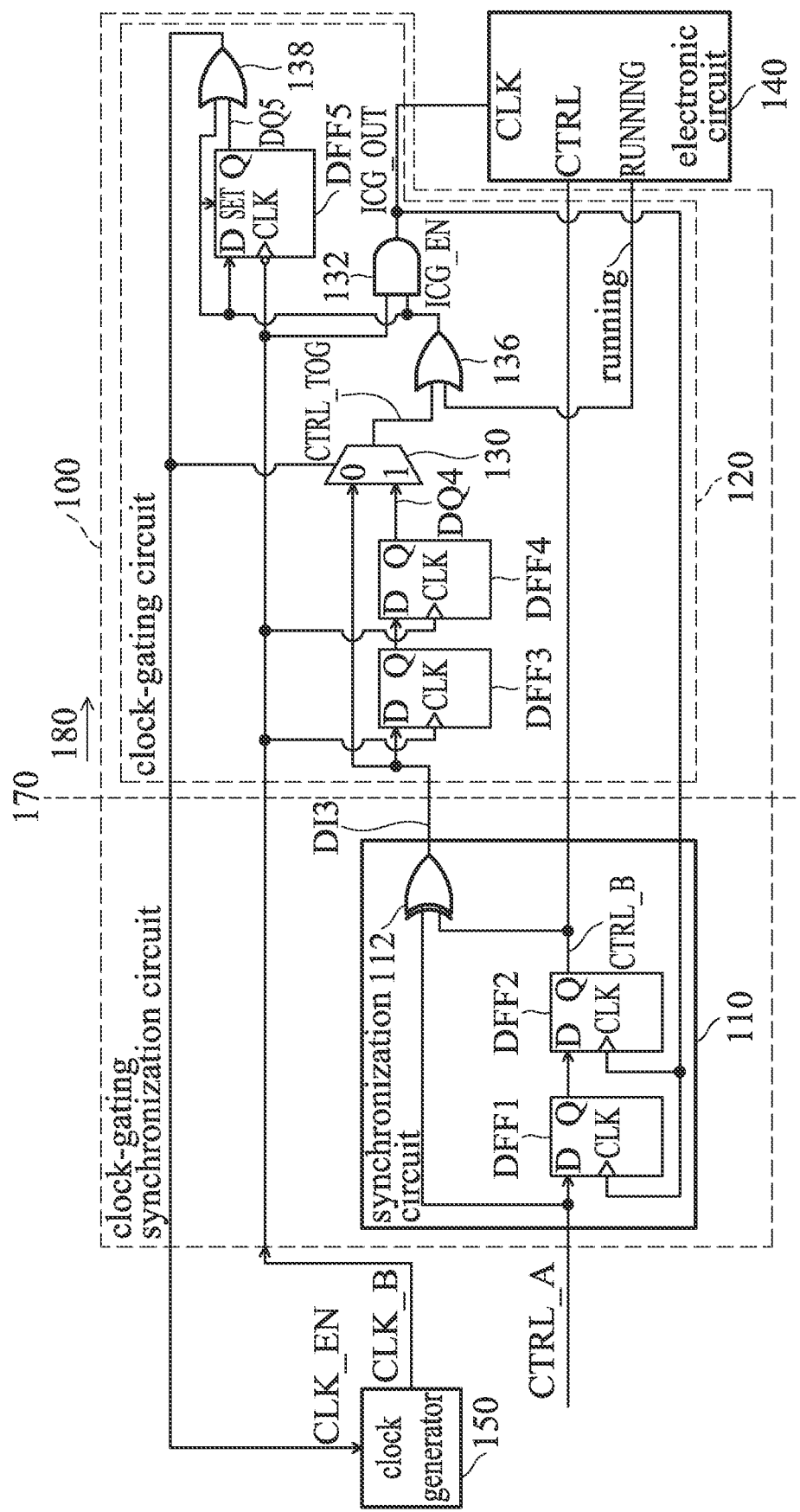
FIG. 1 is a block diagram of a clock-gating synchronization circuit in accordance with an embodiment of the invention.

FIG. 1 is a block diagram of a clock-gating synchronization circuit in accordance with an embodiment of the invention.

As depicted in FIG. 1, the clock-gating synchronization circuit may receive a control signal CTRL_A in a first clock domain, a clock signal CLK_B in a second clock domain, and an operation signal "running" generated by an electronic circuit 140, and convert the control signal CTRL_A in the first clock domain to a control signal CTRL_B in the second clock domain, and output a gated clock signal ICT_OUT to the electronic circuit 140. For example, the control signal CTRL_A may be controlled by a clock signal CLK_A in the first clock domain, and the electronic circuit 140 may operate according to the clock signal CLK_B in the second clock domain, wherein the clock signals CLK_A and CLK_B may have different frequencies and/or phases. The electronic circuit 140 can be regarded as a general term for electronic circuits operating in the second clock domain, and is not limited to one electronic circuit. For example, the region 180 on the right side of the dotted line 170 belongs to the second clock domain.

The clock-gating synchronization circuit 100 may include a synchronization circuit 110, D flip-flops DFF3 and DFF4, a multiplexer 130, an ICG cell 132, and OR gates 136 and 138.

In an embodiment, for convenience of description, the synchronization circuit 110 may include D flip-flops DFF1 and DFF2, and an XOR gate 112. The clock input terminals CLK of the D flip-flops DFF1 and DFF2 are controlled by the gated clock signal ICG_OUT (i.e., belonging to the second clock domain). The control signal CTRL_A is input to the data terminal D of the D flip-flop DM, and the output terminal Q of the D flip-flop DFF1 is connected to the data terminal D of the D flip-flop DFF2. The control signal CTRL_A in the first clock domain can be converted to the control signal CTRL_B in the second clock domain after passing through the D flip-flops DFF1 and DFF2, and the control signal CTRL_B can be directly input to the control terminal CTRL of the electronic circuit 140. It should be noted that the synchronization operation performed by the synchronization circuit 110 is not limited to the use of two D flip-flops, and can also be implemented by other synchronization circuits in the art of the present invention.

The control signals CTRL_A and CTRL_B are input to the two input terminals of the XOR gate 112, where the control signals CTRL_A and CTRL_B are the input signal and the output signal of the synchronization circuit 110, respectively. When the control signals CTRL_A and CTRL_B have the same logic level (e.g., both are 1 or 0), the output signal DI3 of the XOR gate 112 has a logic level of 0. When the control signals CTRL_A and CTRL_B have different logic levels (e.g., one is 1 and the other is 0), the output signal DI3 of the XOR gate 112 has a logic level of 1. The signal DI3 is input to the data terminal of the D flip-flop DFF3 and the input terminal 0 of the multiplexer 130. It should be noted that the XOR gate 112 may be used to generate the signal D13 by determining whether the control signals CTRL_A and CTRL_B have the same logic level. The synchronization circuit 110 of the present invention is not limited to the use of XOR gate 112 for the aforementioned determination, and can also be implemented by other circuits or logic gates with the same function in the art of the present invention.

The clock input terminals CLK of the D flip-flops DFF3 and DFF4 are controlled by the clock signal CLK_B in the second clock domain. The output terminal Q of the D flip-flop DM is connected to the data terminal D of the D flip-flop DFF4. The signal DQ4 from the output terminal of the D flip-flop DFF4 is input to the input terminal 1 of the multiplexer 130. It should be noted that the D flip-flops DFF3 and DFF4 can also form another synchronization circuit to perform the synchronization operation of the signal DI3. The synchronization operation performed by the D flip-flops DFF3 and DFF4 can also be implemented by other synchronization circuits in the art of the present invention.

The clock-enable signal CLK_EN is input to the control terminal of the multiplexer, and the multiplexer 130 outputs a toggle signal CTRL_TOG. The two input terminals of the OR gate 136 may receive the toggle signal CTRL_TOG and the operation signal "running" from the electronic circuit 140 to generate the clock-gating enable signal ICG_EN.

The two input terminals of the ICG cell 132 may respectively receive the clock signal CLK_B and the clock-gating enable signal ICG_EN, and generate the gated dock signal ICG_OUT, wherein the gated clock signal ICG_OUT is provided to the clock input terminals CLK of the D flip-flops DUI and DFF2 and the clock input terminal CLK of the electronic circuit 140. In some embodiments, the ICG 132 can be implemented by an AND gate. In some other embodiments, the ICG cell 132 can be implemented by a D flip-flop and an AND gate, where the D flip-flop receives the clock-gating enable signal ICG_EN, and the output terminal of the D flip-flop and the dock signal CLK_B are input to the AND gate to generate the gate clock signal ICG_OUT. It should be noted that the ICG cell 132 is not limited to the aforementioned two embodiments, and those having ordinary skill in the art can select a suitable ICG cell 132 according to practical design requirements.

The clock-gating enable signal ICQ_EN is input to one input terminal of the OR gate 138, and the data terminal D and the set terminal SET of the D flip-flop DFF5. The signal DQ5 from the output terminal of the D flip-flop DFF5 is input to another input terminal of the OR gate 138, and the OR gate 138 outputs the clock-enable signal CLK_EN.

The electronic circuit 140 starts to perform tasks in response to the change in the logic state of the control signal CTRL_B (e.g., changing from 0 to 1). While the electronic circuit 140 is performing these tasks, the operation signal "running" output by the electronic circuit 140 at the output terminal RUNNING is in the high-logic state. After the tasks of the electronic circuit 140 are completed, the operation signal "running" output by the electronic circuit 140 at the output terminal RUNNING is in the low-logic state.

Figure 2:
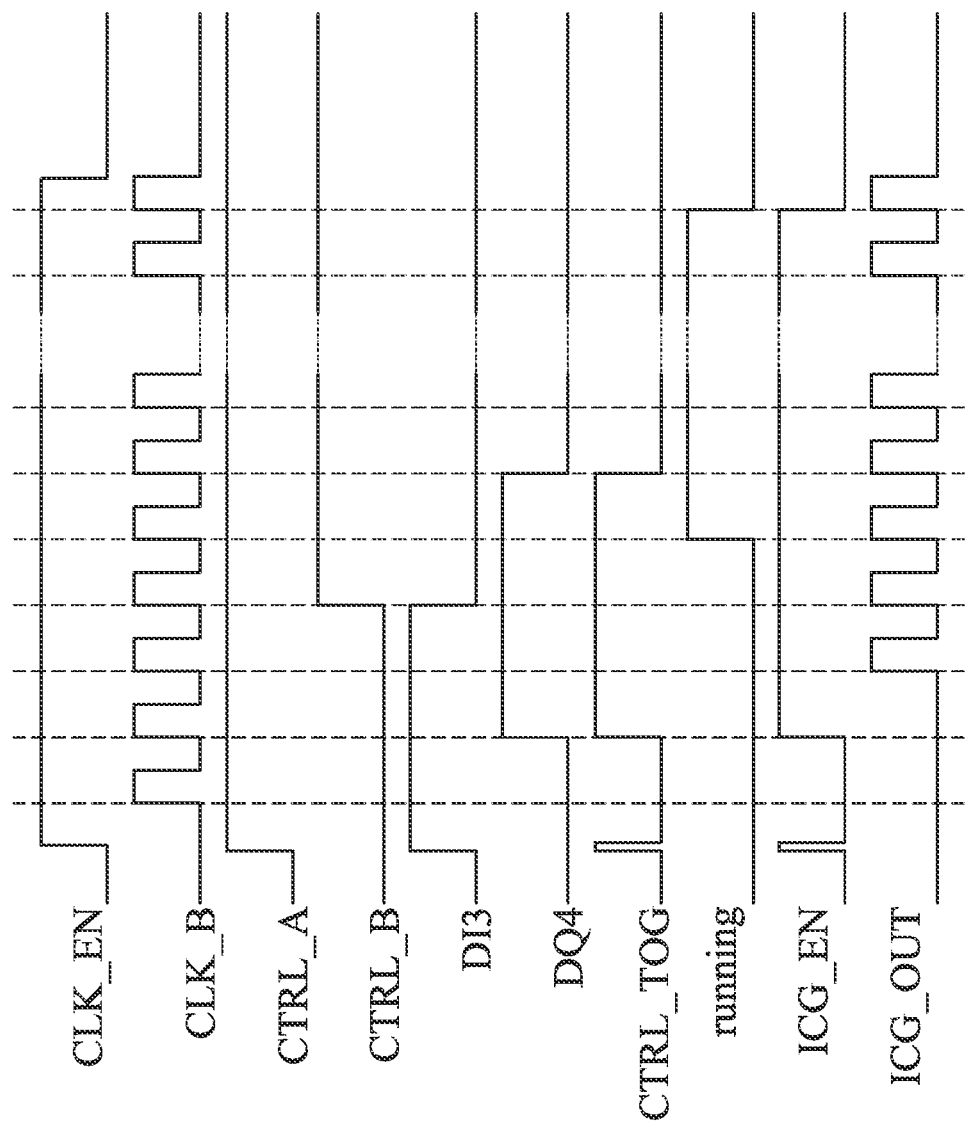
FIG. 2 is a waveform diagram of the operations of the clock-gating synchronization circuit in accordance with the embodiment of FIG. 1.

FIG. 2 is a waveform diagram of the operations of the clock-gating synchronization circuit in accordance with the embodiment of FIG. 1.

In the first scenario, a synchronization event occurs during the period when the clock signal CLK_B is turned off, for example, the clock-gating synchronization circuit 100 is in a power-saving state at this time. Assuming that the clock-gating synchronization circuit 100 is initially in the power-saving state and the clock-enable signal CLK_EN is in the low-logic stat (e.g., 0), at this time, the clock generator 150 will stop outputting the dock signal CLK_B (e.g., may be kept at the low-logic state or high-logic state), and thus the gated clock signal ICG_OUT will be kept at the low-logic state or high-logic state. When the logic state of the control signal CTRL_A in the first clock domain changes (e.g., from 0 to 1), sincethe gated clock signal ICG_OUT received by the D flip-flops DFF1 and DFF2 of the synchronization circuit 110 is not changed, and thus the synchronization circuit 110 cannot convert the clock signal CTRL_A in the first dock domain to the control signal CTRL_B in the second clock domain at this time. Accordingly, during the change of the logic state of the control signal CTRL_A, the logic states of the control signals CTRL_A and CTRL_B are different, and the signal D13 output by the XOR gate 112 is in the high-logic state (e.g., 1).

In addition, because the clock-enable signal CLK_EN is in the low-logic state, the multiplexer 130 will select the signal D13 at the input terminal 0 as the output signal, that is the toggle signal CTRL_TOG is in the high-logic state at this time. Thus, the clock-gating enable signal ICG_EN generated by the OR gate 136 is also in the high-logic state, and the clock-gating enable signal ICG_EN passes through the OR gate 138 to set the clock-enable signal CLK_EN to the high-logic state in an asynchronous manner to control the clock generator 150 to output the clock signal CLK_B, so there will be no cross-clock domain problem for the electronic circuit 140. In response to the clock-enable signal CLK_EN being in the high-logic state, the multiplexer 130 will select the signal DO4 at the input terminal 1 as the output toggle signal CTRL_TOG. Accordingly, it can be seen from FIG. 2 that after the toggle signal CTRL_TOG initially changes from the low-logic state to the high-logic state, the toggle signal CTRL_TOG will be switched to the low-logic state after being maintained in the high-logic state tier a relatively short time.

It should be noted that, in the initial state of the first scenario, the dock signal CLK_B is not turned on, so for the electronic circuit 140, there is no need to consider the cross-dock domain problem. After the logic state of the control signal CTRL_B in the second clock domain is changed (e.g., from 0 to 1), the electronic circuit 140 will start to pertbrm work on the positive edge of the next clock signal CLK_B. While the electronic circuit 140 is performing tasks, the operating signal "running" output by the electronic circuit 140 at the output terminal RUNNING will be in the high-logic state. When the tasks of the electronic circuit 140 are completed, the operating signal "running" output by the electronic circuit 140 at the output terminal RUNNING will be in the low-logic state, Because the togge signal CTRL_TOG is already in the low-logic state at this time, when the operating signal "running" changes from the high-logic state to the low-logic state, the clock-gating enable signal ICG_EN will also change from the high-logic state to the low-logic state.

In response to the clock-gating enable signal ICG_EN changing from the high-logic state to the low-logic state, in the next cycle of the clock signal CLK_B, the gated clock signal ICG_OUT output by the ICG cell 132 will be maintained in the low-logic state. In addition, in response to the clock-gating enable signal ICG_EN changing from the low-logic state to the high-logic state, the output terminal Q of the D flip-flop DFF5 will change from the high-logic state to the low-logic state at the next negative edge of the clock signal CLK_B, thereby avoiding glitches to prevent the clock-gating synchronization circuit 100 from rapidly switching between the working state and the power-saving state. At this time, the clock-enable signal CLK_EN output by the OR gate 138 will change from the high-logic state to the low-logic state, thereby turning off the clock signal CILK_B output by the clock generator 150.

Figure 3:
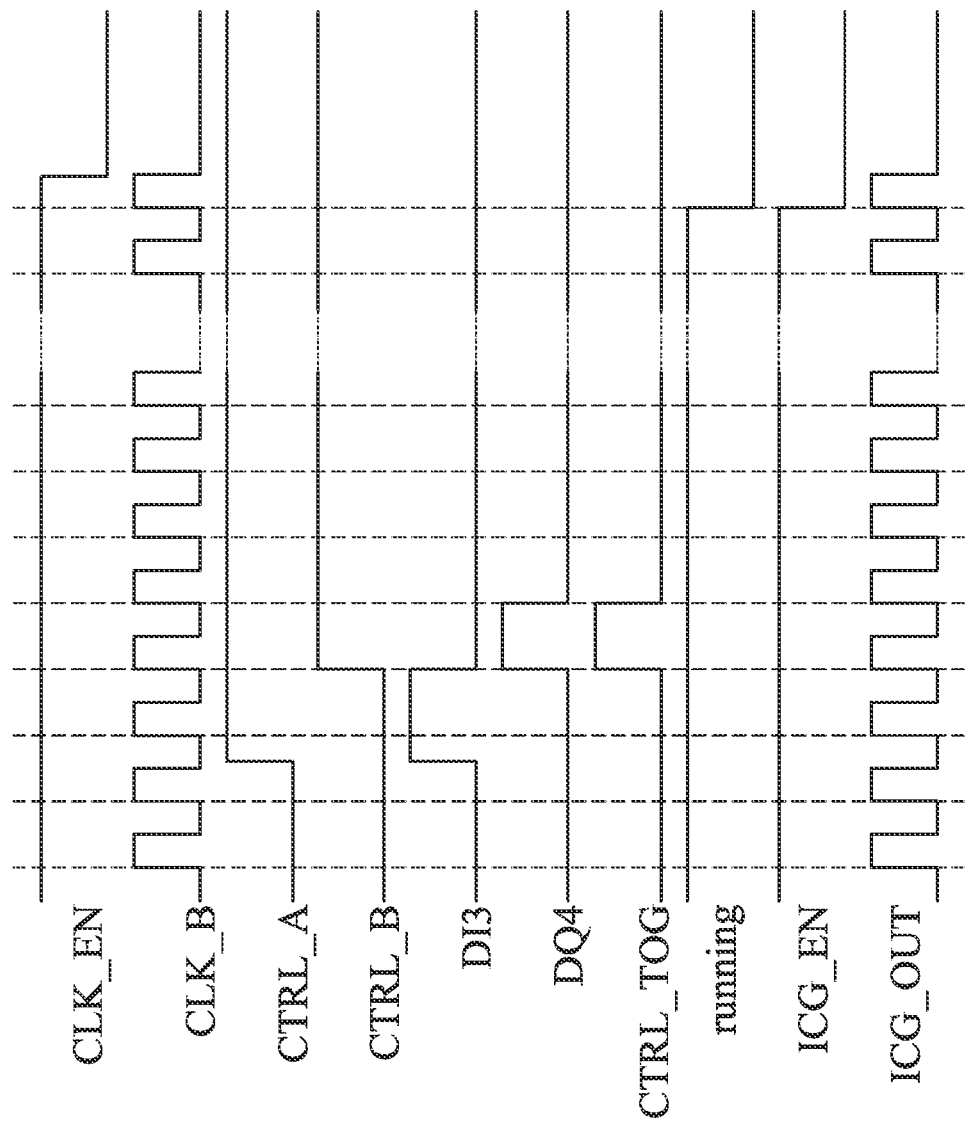
FIG. 3 is a waveform diagram of the operations of the clock-gating synchronization circuit in accordance with the embodiment of FIG. 1.

FIG. 3 is a waveform diagram of the operations of the clock-gating synchronization circuit in accordance with the embodiment of FIG. 1.

In the second scenario, a synchronization event occurs during the period when the clock signal CLK_B is turned on, for example, the clock-gating synchronization circuit 100 is in a working stale at this time. Assuming that the clock-gating synchronization circuit 100 is initially in the working state and the clock-enable signal CLK_EN is in the high-logic state (e.g. 1), at this time, the clock generator 150 will normally output the clock signal CLK_B. When the logic state of the control signal CTRL_A in the first clock domain changes (e.g., from 0 to 1), since the ICG cell 132 normally outputs the gated clock signal ICG_OUT, the D flip-flops DM and DI T2 can convert the control signal CTRL_A in the first clock domain to the control signal CTRL_B in the second clock domain.

Because the synchronization circuit 110 requires two clock cycles to convert the control signal CTRL_A to the control signal CTRL_B, the signal Dl3 output by the XOR gate 112 will be in the low-logic state first, and when the logic states of the control signals CTRL_A and CTRL_B are different, the signal Dl3 output by the XOR gate 112 will be in the high-logic state. After two clock cycles, the synchronization circuit 110 has successfully converted the control signal CTRL_A in the first clock domain to the control signal CTRL_B in the second clock domain, at this time, the logic states of the control signals CTRL_A and CTRL_B are the same. Thus, the signal Dl3 output by the XOR gate 112 will switch to the low-logic state again.

It should be noted that because the clock-enable signal CLK_EN is maintained in the high-logic state, the multiplexer 130 will select the signal DQ4 at the input terminal 1 as the output toggle signal CTRL_TOG. As depicted in FIG. 3, the signal DQ4 switches to the low-logic state after being maintained in the high-logic state for one clock cycle, so the toggle signal CTRL_TOG also switches to the low-logic state other being maintained in the high-logic state for at least one clock cycle. It should be noted that the number of clock cycles maintained in the high-logic state can vary with synchronization circuits of different architectures or different synchronization time points.

When the toggle signal CTRL_TOG is in the high-logic state and the operating signal "running" is also in the high-logic state, the clock-gating enable signal ICG_EN output by the OR gate 136 is also in the high-logic state, so the ICG cell 132 can be controlled to output the clock signal CLK_B as the gated clock signal ICG_OUT.

When the toggle signal CTRL_TOG switches to the low-logic state, because the electronic circuit 140 is still in the working state, the operating signal "running" generated by the electronic circuit 140 is also maintained in the high-logic state. Accordingly, the clock-gating enable signal ICG_EN output by the OR gate 136 is also in the high-logic state, so the ICG cell 132 can be controlled to output the clock signal CLK_B as the gated clock signal ICG_OUT.

After the tasks of the electronic circuit 140 are completed, the operating signal "running" output by the electronic circuit 140 at the output terminal RUNNING is in the low-logic state. Because the toggle signal CTRL_TOG is in the low-logic state at this time, when the operative signal "running" changes from the high-logic state to the low-logic state, the clock-gating enable signal ICG_EN output by the OR gate 136 will also charuze from the high-logic state to the low-logic state.

In response to the clock-eating enable signal ICG_EN changing from the high-logic state to the low-logic state, at the next cycle of the clock signal CLK_B, the gated clock signal ICG_OUT output by the ICG cell 132 will be maintained in the low-logic state. In addition, in response to the clock-gating enable signal ICG_EN changing from the high-logic state to the low-logic state, the output terminal Q of the D flip-flop DFFS will change from the high-logic state to the low-logic state at the next negative edge of the clock signal CLK_B, thereby avoiding glitches to prevent the clock-gating synchronization circuit 100 from rapidly switching between the working state and the power-saving state. At this time, the clock-enable signal CLK_EN output by the OR gate 138 will change from the high-logic state to the low-logic stale, thereby turning off the clock signal CLK_B output by the clock generator 150.

Figure 4:
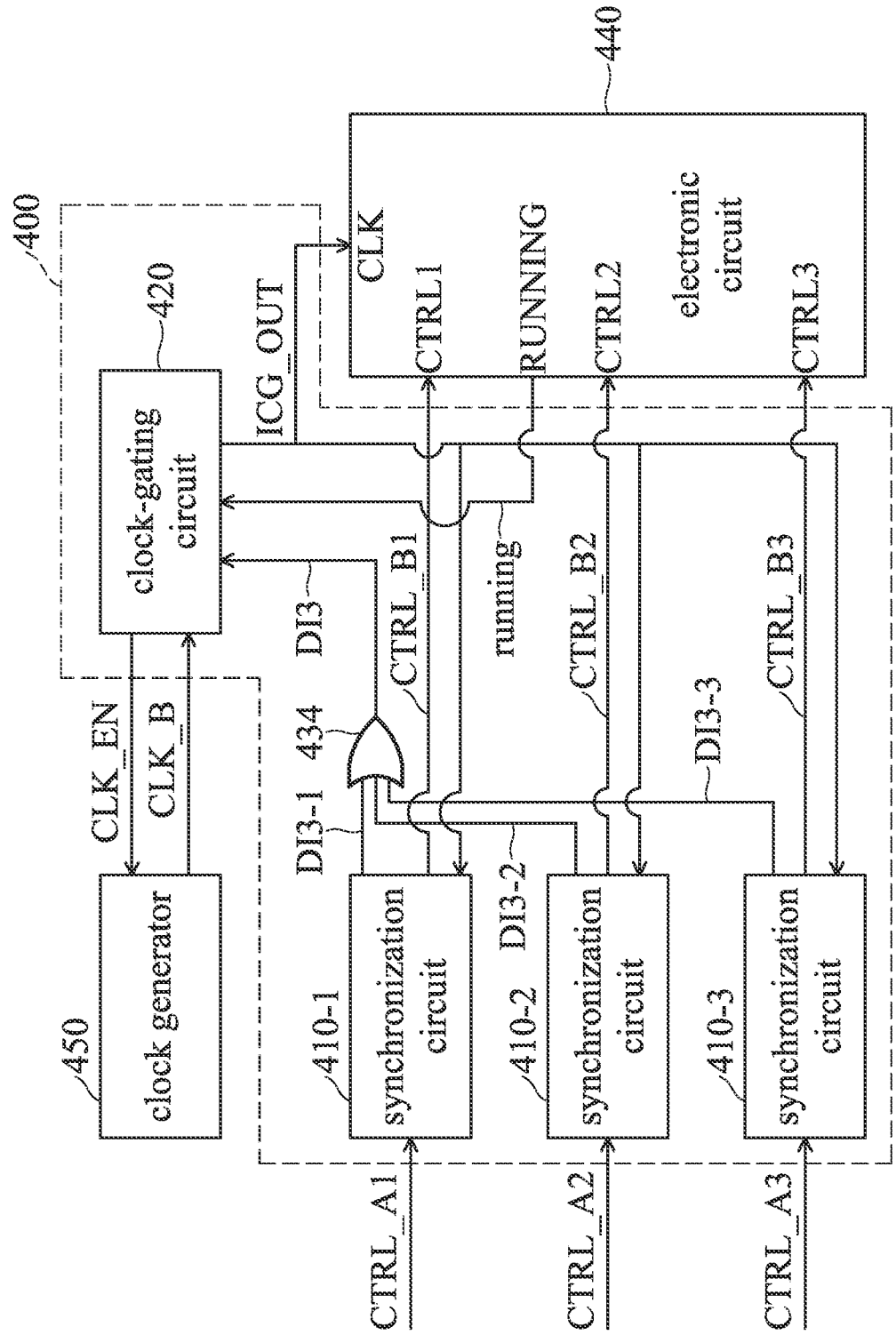
FIG. 4 is a block diagram of the clock-gating synchronization circuit in accordance with another embodiment of the invention.

FIG. 4 is a block diagram of the clock-gating synchronization circuit in accordance with another embodiment of the invention. Please refer to FIG. 1 and FIG. 4.

The clock-gating synchronization circuit 400 in FIG. 4 is similar to the clock-gating synchronization circuit 100 in FIG. 1, and the difference is that the clock-gating synchronization circuit 400 includes a plurality of synchronization circuits 410-1, 410-2, and 410-3, where each of the synchronization circuits 410-1, 410-2, and 410-3 are identical to the synchronization circuit 110 in FIG. 1, and the clock-gating circuit 420 is identical to the clock-gating circuit 120 in FIG. 1. Since the electronic circuit 440 may have different control signals, for convenience of description, the electronic circuit 440 may include a plurality of control terminals CTRL1, CTRL2, and CTRL3.

For example, the synchronization circuits 410-1, 410-2, and 410-3 may receive control signals CTRL_A1, CTRL_A2, and CTRL_A3 from the first clock domain, and may convert the control signals CTRL_A1, CTRL_A2, and CTRL_A3 in the first clock domain to the control signals CTRL_B1, CTRL_B2, and CTRL_B3 in the second clock domain in a similar manner described in the embodiment of FIG. 1, respectively. The control signals CTRL_B2, and CTRL_B3 are input to the control terminals CTRL1, CTRL2, and CTRL3 of the electronic circuit 440, respectively.

It should be noted that the synchronization circuits 410-1, 410-2, and 410-3 is coupled to the clock-gating circuit 420 via the OR gate 434. For example, the XOR gate in the synchronization circuit 410-1 may perform XOR operation on the control signals CTRL_A1 and CTRL_B1 (i.e., determining whether the control signals CTRL_A1 and CTRL_B1 are the same) to generate the signal DI3-1. The XOR gate in the synchronization circuit 410-2 may perform XOR operation on the control signals CTRL_A2 and CTRL_B2 to generate the signal DI3-2. The XOR gate in the synchronizationcircuit 410-3 may perform XOR operation on the control signals CTRL_A3 and CTRL_B3 to generate the signal DI3-3. Similar to the embodiment of FIG. 1, the XOR gates in the synchronization circuits 410-1, 410-2, and 410-3 can be implemented by other circuits or logic gate with the same function. The signals DI3-1, DI3-2, and DI3-3 are input to the OR gate 434 to generate the signal DI3. The details for the operations after inputting the signal DI3 to the clock-gating circuit 420 can be referred to the operations of the clock-gating circuit 120 in the embodiment of FIG. 1, and thus the details are not repeated here.

In some embodiments, the synchronization circuits 410-1, 410-2, and 410-3 will receive the control signal CTRL_A1 from the first clock domain, the control signal CTRL_C1 from the third clock domain, and the control signal CTRL_A3 from the first clock domain, respectively. Meanwhile, the synchronization circuits 410-1, 410-2, and 410-3 may convert the control signals CTRL_A1, CTRL_C1, and CTRL_A3 to the control signals CTRL_B1, CTRL_B2, and CTRL_B3 in the second clock domain using the methods described in the embodiments of FIG. 1 and FIG. 4, where the control signals CTRL_B1, CTRL_B2, and CTRL_B3 are input to the control terminals CTRL1, CTRL2, CTRL3 of the electronic circuit 440. In other words, the synchronization circuits 410-1, 410-2, and 410-3 can respectively receive control signals from different clock domains, and convert the control signals in different clock domains to control signals in the second clock domain. In addition, each D flip-flop in the synchronization circuits 410-1, 410-2, and 410-3 is controlled by the gated clock signal generated by the clock-gating circuit 420.

Figure 5:
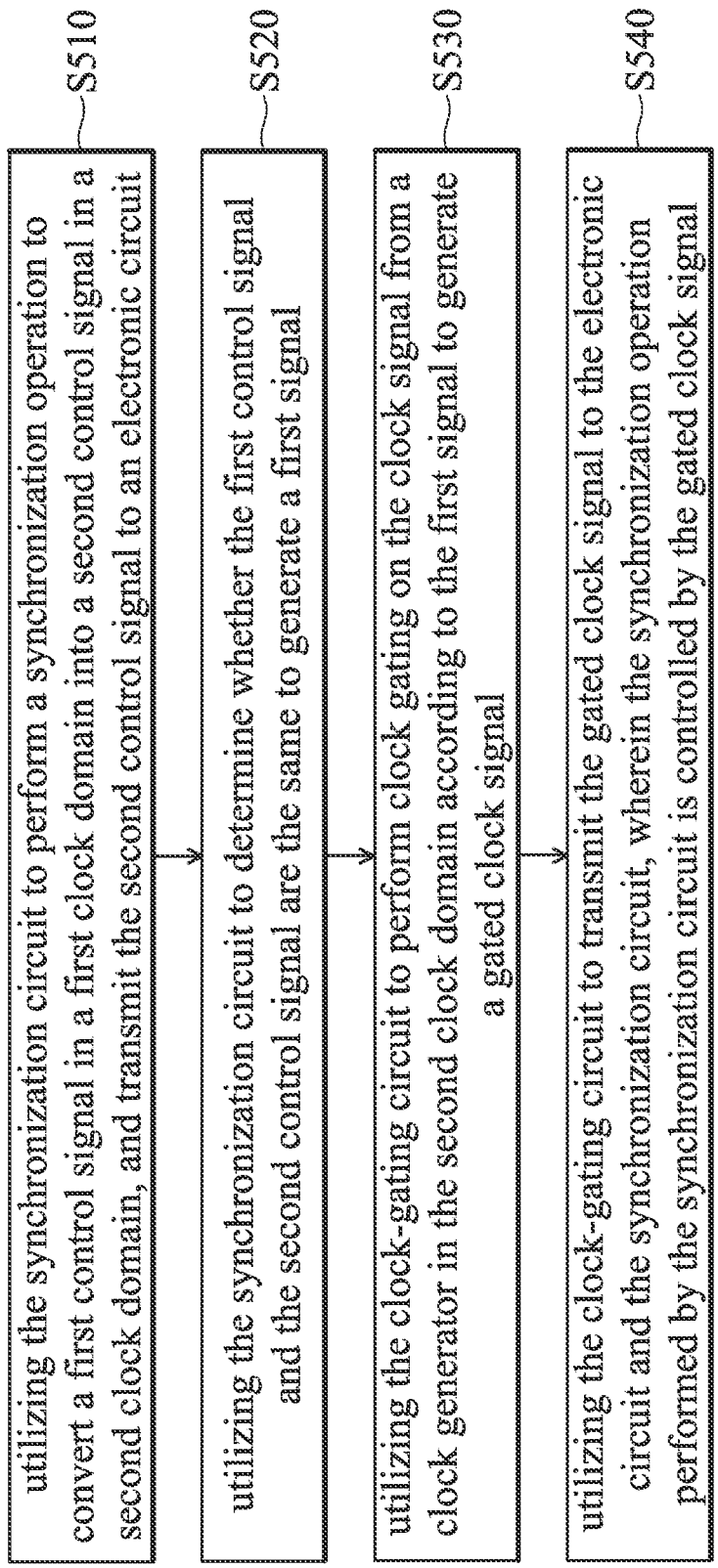
FIG. 5 is a flow chart of a method of clock-gating synchronization in accordance with an embodiment of the invention.

FIG. 5 is a flow chart of a method of clock-gating synchronization in accordance with an embodiment of the invention.

In step S510, the synchronization circuit 110 is utilized to perform a synchronization operation to convert a first control signal in a first clock domain into a second control signal in a second clock domain, and transmit the second clock signal to an electronic circuit 140. For example, the first clock signal (e.g., CLK_A) and the second clock signal (CLK_B) may have different frequencies and/or phases. The electronic circuit 140 can be regarded as a general term for electronic circuits operating in the second clock domain, and is not limited to one electronic circuit.

In step S520, the synchronization circuit 110 is utilized to determine whether the first control signal and the second control signal are the same to generate a first signal. For example, the synchronization circuit 110 may include an XOR gate 112 to perform the determination. It should be noted that the aforementioned determination performed by the synchronization circuit 110 is not limited to the use of the XOR gate 112, and can be implemented by other circuits or logic gates with the same function in the art of the present invention.

In step S530 a clock-gating circuit 120 is utilized to perform clock gating on the clock signal from a clock generator 150 in the second clock domain according to the first signal to generate a gated clock signal. For example, the clock-gating circuit 120 may include a third D flip-flop DFF3, a fourth D flip-flop DFF4, a multiplexer 130, an OR gate 136, an ICG cell 132, a fifth D flip-flop DFF5, and an OR gate 138. The first signal passes through the third D flip-flop DFF3 and the fourth D flip-flop DFF4 to generate a second signal, and the first signal and the second signal are input to the multiplexer 130. The multiplexer 130 is controlled by a clock-enable signal CLK_EN to generate a toggle signal CTRL_TOG. The toggle signal CTRL_TOG and an operating signal "running" from the electronic circuit 140 are input to the OR gate 136 to generate a clock-gating enable signal ICG_EN. The ICG cell 132 may perform clock gating on the clock signal CLK_B according to the clock-gating enable signal ICG_EN to generate the gated clock signal ICG_OUT. The clock-gating enable signal ICG_EN is input to the fifth D flip-flop DFF5 to generate a third signal DQ5, wherein the clock-gating enable signal ICG_EN and the third signal DQ5 are input to the OR gate 138 to generate the clock-enable signal CLK_EN, which is used to control the clock generator 150 to output the clock signal CLK_B.

In step S540 the clock-gating circuit 120 is utilized to transmit the gated clock signal to the electronic circuit 140 and the synchronization circuit 110, wherein a synchronization operation performed by the synchronization circuit 110 is controlled by the gated clock signal ICG_OUT, For example, the clock input terminals of the first D flip-flop DFF1 and the second D flip-flop DFF2 in the synchronization circuit 110 are controlled by the gated clock signal ICG_pur. Accordingly, the first D flip-flop DFF1 and the second D flip-flop DFF2 can also have the function of clock gating to allow the synchronization circuit 110 to achieve low-power design.

In view of the above, a clock-gating synchronization circuit and a method of clock-gating synchronization are provided in the present invention, which are capable of controlling the synchronization operations of the D flip-flops in the synchronization circuit by the gated clock signal output by clock-gating circuit with proper circuit design, thereby further reducing the power consumption of the clock-gating synchronization circuit, and avoiding the problem of the cross-clock domain of the control signals.

The terms such as "first", "second", and "third" are used in the claims to modify the elements in the claims, and are not used to indicate that there is a priority order, prior relationship, or is a component before another component, or the time sequence when performing method steps, only used to distinguish components with the same name.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What s claimed is:

1. A clock-gating synchronization circuit, comprising:
 a synchronization circuit, configured to perform a synchronization operation to convert a first control signal in a first clock domain into a second control signal in a second clock domain, transmit the second control signal to an electronic circuit, and determine whether the first control signal and the second control signal are the same to generate a first signal; and
 a clock-gating circuit, configured to perform clock gating on the clock signal from a clock generator in the second clock domain according to the n first signal to generate a gated clock signal, and transmit the gated clock signal to the electronic circuit and the synchronization circuit,
 wherein the synchronization operation performed by the synchronization circuit is controlled by the gated clock signal.

2. The clock-gating synchronization circuit as claimed in claim 1, wherein the synchronization circuit comprises a first D flip-flop, a second D flip-flop, and an XOR gate, wherein the first control signal passes through the first D flip-flop and the second D flip-flop to generate the second control signal, and the first control signal and the second control signal are input to the XOR gate to generate the first signal.

3. The clock-gating synchronization circuit as claimed in claim 1, wherein the clock-gating circuit comprises a third D flip-flop, a fourth D flip-fop, a multiplexer, a first OR gate, an isolated clock-gating (ICG) cell, a fifth D flip-flop, and a second OR gate,
 wherein the first signal passes through the third D flip-flop and the fourth D flip-flop to generate a second signal, and the first signal and the second signal are input to the multiplexer, and the multiplexer is controlled by a clock-enable signal to generate a toggle signal,
 wherein the toggle signal and an operating signal from the electronic circuit are input to the first OR gate to generate a clock-gating enable signal,
 wherein the ICG cell perform clock gating on the clock signal according to the clock-gating enable signal to generate the gated clock signal, and the clock-gating enable signal is input to the fifth D flip-flop to generate a third signal,
 wherein the clock-gating enable signal and the third signal are input to the second OR gate to generate the clock-enable signal, which is used to control the clock generator to output the clock signal.

4. The clock-gating synchronization circuit as claimed in claim 3, wherein in response to a change of a logic state of the second control signal, the electronic circuit starts to perform tasks,
 wherein while the electronic circuit is performing the tasks, the operating signal output by the electronic circuit is in a high-logic state,
 wherein in response to the tasks performed by the electronic circuit being completed, the operating signal output by the electronic circuit is in a low-logic state.

5. The clock-gating synchronization circuit as claimed in claim 1, further comprising: a second synchronization circuit, configured to perform a second synchronization operation to convert a third control signal in the first clock domain to a fourth control signal in the second clock domain, transmit the fourth control signal to the electronic circuit, and perform an XOR operation on the third control signal and the fourth control signal to generate a fourth signal.

6. The clock-gating synchronization circuit as claimed in claim 3, wherein in response to the clock generator turning off the clock signal, the clock-gating circuit sets the clock-enable signal to the high-logic state in an asynchronous manner to control the clock generator to turn on the clock signal.

7. A method of clock-gating synchronization, for use in a clock-gating synchronization circuit, wherein the synchronization circuit comprises a synchronization circuit and a clock-gating circuit, the method comprising:
 utilizing the synchronization circuit to perform a synchronization operation to convert a first control signal in a first clock domain into a second control signal in a second clock domain, and transmit the second control signal to an electronic circuit;

utilizing the synchronization circuit to determine whether the first control a signal and the second control signal are the same to generate a first signal;

utilizing the clock-gating circuit to perform clock gating on the clock signal from a clock generator in the second clock domain according to the first signal to generate a gated clock signal; and utilizing the clock-gating circuit to transmit the gated clock signal to the electronic circuit and the synchronization circuit, wherein the synchronization operation performed by the synchronization circuit is controlled by the gated clock signal.

8. The method as claimed in claim 7, wherein in response to a change of a logic state of the second control signal, the electronic circuit starts to perform tasks, wherein while the electronic circuit is performing the tasks, the operating signal output by the electronic circuit is in a high-logic state, wherein in response to the tasks performed by the electronic circuit being completed, the operating signal output by the electronic circuit is in a low-logic state.

9. The method as claimed in claim 7, wherein the clock-gating synchronization circuit further comprises a second synchronization circuit, and the method further comprises:

utilizing the second synchronization circuit to perform a second synchronization operation to convert a third control signal in the first clock domain to a fourth control signal in the second clock domain, transmit the fourth control signal to the electronic circuit, and perform an XOR operation on the third control signal and the fourth control signal to generate a fourth signal.

10. The method as claimed in claim 9, wherein the synchronization circuit and the second synchronization circuit are coupled to the clock-gating circuit through a third OR gate, and the first signal and the fourth signal are input to the third OR gate to generate a fifth signal, and the method further comprises:

utilizing the clock-gating circuit to perform clock gating on the clock signal according to the fifth signal to generate the gated clock signal.

* * * * *